United States Patent [19]

Sunahara et al.

[11] Patent Number: 5,057,376
[45] Date of Patent: Oct. 15, 1991

[54] HYBRID PACKAGE, GLASS CERAMIC SUBSTRATE FOR THE HYBRID PACKAGE, AND COMPOSITION FOR THE GLASS CERAMIC SUBSTRATE

[75] Inventors: Kazuo Sunahara; Naosi Irisawa; Katumasa Nakahara; Kazunari Watanabe; Mitsuo Takabatake, all of Yokohama, Japan

[73] Assignee: Asahi Glass Company Ltd., Tokyo, Japan

[21] Appl. No.: 436,738

[22] Filed: Nov. 15, 1989

[30] Foreign Application Priority Data

Nov. 15, 1988 [JP] Japan ............................. 63-286664
Sep. 8, 1989 [JP] Japan ............................. 1-231399

[51] Int. Cl.⁵ ............................................. B32B 17/06
[52] U.S. Cl. ..................................... 428/432; 428/212; 428/428; 428/433; 428/698; 428/699; 428/701; 428/901
[58] Field of Search ............... 428/426, 428, 432, 433, 428/212, 698, 701, 702, 699, 901, 704; 228/121, 124

[56] References Cited

U.S. PATENT DOCUMENTS

| 4,299,873 | 10/1983 | Ogihara et al. | 428/901 |
| 4,536,435 | 8/1985 | Utsumi et al. | 428/209 |
| 4,659,611 | 4/1987 | Iwase et al. | 428/698 |
| 4,729,010 | 3/1988 | Tsuchiya et al. | 428/901 |
| 4,775,596 | 10/1988 | Holleran et al. | 428/901 |
| 4,835,065 | 3/1989 | Sato et al. | 428/901 |
| 4,861,646 | 8/1989 | Barringer et al. | 428/426 |
| 4,873,151 | 10/1989 | Sato et al. | 428/901 |
| 4,961,998 | 10/1990 | Senkalski et al. | 428/432 |

FOREIGN PATENT DOCUMENTS

| 59-22399 | 5/1984 | Japan . |
| 60-8229 | 3/1985 | Japan . |
| 62-290158 | 12/1987 | Japan . |
| 62-291158 | 12/1987 | Japan . |
| 63-18687 | 1/1988 | Japan . |

Primary Examiner—Ellis P. Robinson
Assistant Examiner—Archene A. Turner
Attorney, Agent, or Firm—Oblon, Spivak, McClelland, Maier, & Neustadt

[57] ABSTRACT

A hybrid package comprising a glass ceramic substrate and an aluminum nitride substrate bonded thereto, said glass ceramic substrate has a thermal expansion coefficient substantially the same as that of the aluminum nitride substrate.

7 Claims, 3 Drawing Sheets

HYBRID PACKAGE, GLASS CERAMIC SUBSTRATE FOR THE HYBRID PACKAGE, AND COMPOSITION FOR THE GLASS CERAMIC SUBSTRATE

BACKGROUND OF THE INVENTION

1. Field of the Invention

The present invention relates to a hybrid package, a glass ceramic substrate for the hybrid package and a composition for the glass ceramic substrate. More particularly, it relates to a highly reliable hybrid package wherein a glass ceramic substrate having a thermal expansion coefficient substantially the same as an aluminum nitride substrate is bonded to an aluminum nitride substrate, whereby formation of cracks is minimized, such a glass ceramic substrate and a composition for such a glass ceramic substrate.

2. Discussion of Background

Heretofore, it has been common to prepare a semiconductor circuit board of ceramics by forming a circuit on an inexpensive alumina ($Al_2O_3$) substrate and mounting various elements such as semiconductor elements thereon. However, in recent years, reflecting the trend for high power of semiconductor elements, the quantity of heat generation of the elements tend to increase, whereby the above-mentioned $Al_2O_3$ substrate is not necessarily satisfactory with respect to the heat dissipation property. To solve such a problem, it is conceivable to prepare a circuit board from aluminum nitride (AlN) having an excellent heat dissipation property instead of $Al_2O_3$. However, AlN is far more expensive than $Al_2O_3$, and the peripheral techniques such as metalizing are far behind. Therefore, it is not practical to employ AlN.

Under the circumstances, it has recently been proposed to improve the heat dissipation property and to reduce the cost by preparing a circuit board by a combination of an $Al_2O_3$ plate and an AlN substrate and disposing the AlN substrate only below an element which produces a large amount of heat. (Japanese Unexamined Patent Publications No. 290158/1987 and No. 291158/1987). However, there is a large difference in the thermal expansion coefficient between AlN and $Al_2O_3$ (AlN has a thermal expansion coefficient of about $45 \times 10^{-7}$ C.$^{-1}$, and $Al_2O_3$ has a thermal expansion coefficient of about $75 \times 10^{-7}$ C.$^{-1}$). Therefore, a stress is likely to be created during the use due to the difference in the thermal expansion coefficient, whereby cracks are likely to form at the bonding portion, and in an extreme case, the AlN substrate may fall off. Further, when such a circuit board is sealed to form a package, the hermeticity will be unreliable.

It has also been reported to form a special metal layer at the bonding portion between the AlN substrate and the $Al_2O_3$ plate to reduce the difference in the thermal expansion coefficient and thereby to improve the reliability (Japanese Unexamined Patent Publication No. 18687/1988). However, such a proposal still has a drawback that since the AlN substrate and the $Al_2O_3$ plate which essentially differ in the thermal expansion coefficient are bonded to one another, when the assembly is subjected to an accelerated reliability test, for example, 1000 cycles of a temperature change between $+125°$ C. and $-50°$ C., defects such as peeling or cracks, are likely to form, whereby the hermeticity will be unreliable.

SUMMARY OF THE INVENTION

A primary object of the present invention is to provide a hybrid package which is excellent in the heat dissipation of a semiconductor element and highly reliable without being susceptible to cracking, by bonding an aluminum nitride substrate and a glass ceramic substrate having a heat expansion coefficient substantially the same as the aluminum nitride substrate.

A further object of the present invention is to provide such a glass ceramic substrate excellent in the strength and electrical properties and to provide a composition for such a glass ceramics substrate.

The present inventors have found that formation of cracks can be reduced by bonding a glass ceramic substrate having a thermal expansion coefficient substantially the same as the thermal expansion coefficient of AlN to an AlN substrate. Further, they have found a composition for a glass ceramic substrate which has substantially the same thermal expansion coefficient and yet is excellent in the burneoutability. Thus, they have succeeded in the production of a hybrid package excellent in the strength and electrical properties.

The present invention provides a hybrid package comprising a glass ceramic substrate and an aluminum nitride substrate bonded thereto, said glass ceramics substrate has a thermal expansion coefficient substantially the same as that of the aluminum nitride substrate.

The present invention also provides a composition for glass ceramic substrate for a hybrid package, which comprises inorganic components consisting essentially of from 50 to 91% by weight of alumina, from 5 to 30% by weight of $SiO_2$, from 3 to 20% by weight of PbO, from 0 to 15% by weight of $B_2O_3$, from 0.5 to 15% by weight of an alkaline earth metal oxide and from 0 to 6% by weight of oxides of Ti+Zr+Hf, and from 0.05 to 10% by weight, based on the total amount of the inorganic components, of $Cr_2O_3+V_2O_5+CeO_2+CoO+SnO_2$.

DETAILED DESCRIPTION OF THE PREFERRED EMBODIMENTS

Figure 1:
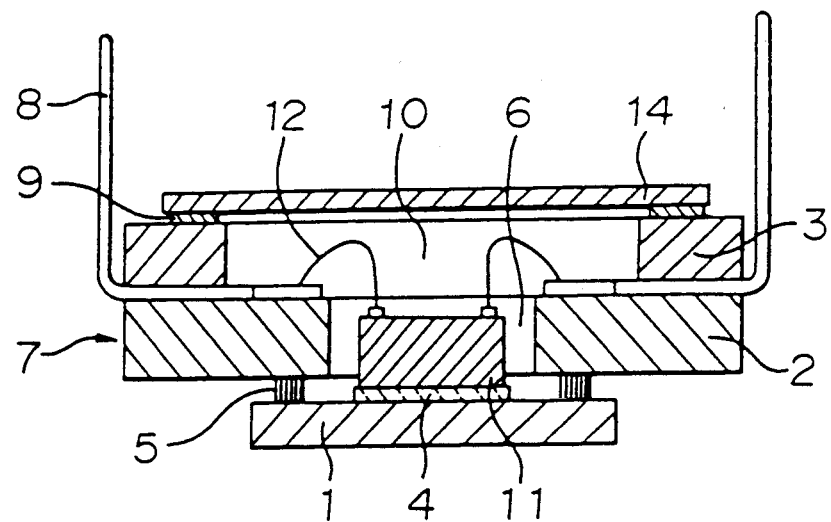
FIG. 1 shows a cross sectional view of a typical embodiment of the hybrid package of the present invention.

It is an object of the present invention to provide a hybrid package having high reliability without being susceptible to cracking, by bonding to an AlN substrate a glass ceramic substrate having a thermal expansion coefficient substantially the same as the AlN substrate. Therefore, the glass ceramic substrate is a substrate made of glass and a ceramics filler. FIG. 1 shows a cross sectional view of a typical embodiment of the hybrid package of the present invention. In FIG. 1, reference numeral 1 indicates an AlN substrate, numerals 2 and 3 indicate glass ceramic substrates, numeral 4 indicates a gold (Au) layer, numeral 5 indicates a bonding portion between the AlN substrate 1 and the glass ceramic substrate 2, numeral 6 indicates an opening of the glass ceramic substrate 2, numeral 7 is the side surface of the glass ceramic substrates 2 and 3, numeral 8 is a lead frame, numeral 9 is a bonding portion between an upper cover and the glass ceramic substrate 3, numeral 10 is an opening of the glass ceramic substrate 3, numeral 11 is an IC bare chip, numeral 12 is a wire, and numeral 14 is the upper cover made of glass ceramics.

The AlN substrate 1 preferably has a heat conductivity of at least 100 w/mK for the heat dissipation of an IC bare chip 11 mounted on the AlN substrate 1. As such an AlN substrate 1, commercially available AGN-1 or AGN-2 (trade mark) manufactured by Asahi Glass Company Ltd., may, for example, be used.

The glass ceramic substrates 2 and 3 preferably have the following properties so that circuit patterns may satisfactory be formed:

Thermal expansion coefficient: $43-63 \times 10^{-7}$ °C.$^{-1}$
Dielectric constant: Less than 9.0
Conductor used: Au (gold), Ag (silver), Ag-Pd (silver-palladium), Cu (copper), Au-Pt (gold-platinum)

There is no particular restriction as to the material for the glass ceramic substrates 2 and 3, so long as they have substantially the same thermal expansion coefficient as the AlN substrate 1. For example, the above-mentioned AlN substrate i.e. AGN-1 or AGN-2 having a thermal expansion coefficient of about $45 \times 10^{-7}$ °C.$^{-1}$, manufactured by Asahi Glass Company, is used, glass ceramics having the following composition may be used as glass ceramic substrates having substantially the same thermal expansion coefficient. In this specification, "%" means "% by weight" unless otherwise specifically indicated.

Namely, the composition for glass ceramic substrates may comprise from 30 to 70% of glass frit comprising:

| | |
|---|---|
| SiO$_2$ | 38-48% |
| Al$_2$O$_3$ | 1-8% |
| MgO | 0-10% |
| BaO | 18-28% |
| CaO | 1-8% |
| SrO | 0-15% |
| B$_2$O$_3$ | 0.5-15% |
| PbO | 0-20% |
| ZnO | 10-20% |
| TiO$_2$ + ZrO$_2$ | 0-7% |
| LiO$_2$ + NaO$_2$ + K$_2$O | 0-5% | from 28 to 70% of a refractory filler, and an oxidizing agent such as CeO$_2$, wherein said refractory filler comprises:

| | |
|---|---|
| Alumina | 20-60% |
| Zircon | 0-40% |
| Cordierite | 0-30% |
| Forsterite | 0-30%. |

As another example, they may be produced from a composition for a glass ceramic substrate comprising from 25 to 65% of glass frit, from 0 to 60% of Al$_2$O$_3$ powder and from 5 to 60% of 2MgO.SiO$_2$ powder, wherein the glass frit has a composition comprising:

| | |
|---|---|
| SiO$_2$ | 40-70% |
| Al$_2$O$_3$ | 4-15% |
| B$_2$O$_3$ | 15-35% |

-continued

| | |
|---|---|
| BaO | 0.5-15%. |

If necessary, an oxidizing agent such as CeO$_2$ may be added to the above composition to remove the organic binder.

The glass ceramic substrates as described above, have flexural strength of about 2000 kg/cm$^2$. As a further example of a glass ceramic substrate having higher flexural strength, the following may be mentioned:

| | |
|---|---|
| Alumina (Al$_2$O$_3$) | 50-91% |
| SiO$_2$ | 5-30% |
| PbO | 3-20% |
| B$_2$O$_3$ | 0-15% |
| Alkaline earth metal oxides (MgO + CaO + SrO + BaO) | 0.5-15% |
| Oxides of Ti + Zr + Hf | 0-6% |

The thermal expansion coefficient of this glass ceramic substrate is about from 42 to $63 \times 10^{-7}$ (°C$^{-1}$). This composition will be described in further detail.

This glass ceramic substrate contains alumina in the largest amount, and the content of alumina is related to the strength of this glass ceramic substrate and to the reactivity with conductors for e.g. wiring.

If alumina is less than 50%, the reactivity of this glass ceramic substrate with a surface conductor tends to be high, whereby solderability of the conductor will be impaired, such being undesirable. If it exceeds 91%, the dielectric constant tends to be high exceeding 9.0, such being undesirable. Further, the larger the alumina content, the higher the flexural strength of the glass ceramic substrate. From these points, alumina is required to be within a range of from 50 to 91%. The preferred range is from 55 to 80%, and the particularly preferred range is from 60 to 70%.

If SiO$_2$ is less than 5%, such a glass ceramic substrate tends to be hardly sintered. If it exceeds 30%, the flexural strength tends to decrease. Therefore, SiO$_2$ is required to be from 5 to 30%. The preferred range is from 10 to 20%, and the particularly preferred range is from 15 to 19%.

If PbO is less than 3%, such a glass ceramic substrate tends to be hardly sintered, such being undesirable. If it exceeds 20%, such a glass ceramic substrate tends to have a high dielectric constant, such being undesirable. Therefore, it is required to be within a range of from 3 to 20%. The preferred range is from 10 to 18%, and the particularly preferred range is from 14 to 17%.

B$_2$O$_3$ is a flux component. If it exceeds 15%, the water resistance tends to deteriorate. It is therefore required to be within a range of 0 to 15%. The preferred range is from 0.5 to 5%, and the particularly preferred range is from 1 to 3%.

If the alkaline earth metal oxides are less than 0.5%, the sintering tends to be poor, such being undesirable. If they exceed 15%, such a glass ceramic substrate will have a large dielectric constant, such being undesirable. They are preferably from 1 to 5%, more preferably from 1.5 to 3%.

The oxides of Ti+Zr+Hf improve the thermal expansion coefficient when incorporated. However, if they exceed 6%, the dielectric constant tends to be poor, such being undesirable. The desired range is not higher than 3%. Particularly preferred is a range of not higher than 1%. Among these three oxides of Ti+Zr+Hf, only one may be used without containing other oxides.

From the foregoing, a preferred composition of this glass ceramic substrate is as follows:

| | |
|---|---|
| Alumina ($Al_2O_3$) | 55-80% |
| $SiO_2$ | 10-20% |
| PbO | 10-18% |
| $B_2O_3$ | 0.5-5% |
| Alkaline earth metal oxides | 1-5% |
| Ti + Zr + Hf | 0-3%. |

A particularly preferred range of the composition is:

| | |
|---|---|
| Alumina ($Al_2O_3$) | 60-70% |
| $SiO_2$ | 15-19% |
| PbO | 14-17% |
| $B_2O_3$ | 1-3% |
| Alkaline earth metal oxides | 1.5-3% |
| Ti + Zr + Hf | 0-1%. |

A part of this glass ceramic substrate composition may be one of crystalline, non-crystalline and vitrous phases, or may be a mixture of two or more of such phases, without affecting the effects of the present invention.

To such glass ceramic substrate composition as described above, from 0 to 5%, based on the total amount of the inorganic components, of a clarificator and a fusing accelerator such as a nitrate, arsenious acid, antimony oxide, a sultate, a fluoride or a chloride, may be added at the time of melting glass. Further, from 0 to 5% of a coloring agent (such as a heat resisting inorganic pigment or a metal oxide) may be added.

When a metal oxidizable in air, such as Cu, W, Mo-Mn or Ni, is used as a conductive material, firing is required to be conducted in an inert atmosphere such as nitrogen or in a nitrogen-hydrogen atmosphere. In such a case, in order to accelerate the burning of binder from a glass ceramic substrate, $Cr_2O_3$, $V_2O_5$, $CeO_2$, CoO and $SnO_2$ may be added alone or in combination as a mixture, as an oxidizing agent, in an amount of from 0.05 to 10% relative to the total amount of the inorganic components in the glass ceramic composition.

However, if the amount of addition exceeds 1%, the insulation resistance of the glass ceramic substrate tends to be low, such being undesirable, and if the amount is less than 0,05%, it tends to be difficult to accelerate the burning of the binder.

In the present invention, the oxidizing agent is preferably added in an amount of from 0.5 to 5% by weight, more preferably within a range of from 1 to 3% by weight. Among the five oxidizing agents, $Cr_2O_3$ and CoO are preferred, and $Cr_2O_3$ is particularly preferred. A ceramic substrate having such an oxidizing agent incorporated and fired will have a composition comprising inorganic components consisting essentially of from 50 to 91% of alumina, from 5 to 30% of $SiO_2$, from 3 to 20% of PbO, from 0 to 15% of $B_2O_3$, from 0.5 to 15% of alkaline earth metal oxides and from 0 to 6% of oxides of Ti+Zr +Hf, and from 0 to 10%, based on the total amount of the above inorganic components, of chlomium oxide+vanadium oxide+cerium oxide+cobalt oxide+tin oxide where the chromium oxide is calculated as $Cr_2O_3$, the vanadium oxide is calculated as $V_2O_5$, the cerium oxide is calculated as $CeO_2$, the cobalt oxide is calculated as CoO and the tin oxide is calculated as $SnO_2$.

These glass ceramic substrates can be prepared, for example, as follows.

To the above-mentioned glass ceramic substrate composition, an organic binder, a plasticizer and a solvent are added and kneaded to prepare a slurry. As the organic binder, a butyral resin or an acrylate resin may be employed. A the plasticizer, dibutyl phthalate, dioctyl phthalate or butylbenzyl phthalate may be used. As the solvent, a commonly employed solvent such as toluene or an alcohol may be used.

Then, this slurry is formed into a sheet and dried to obtain a non-sintered sheet which is a so-called green sheet. Then, through-holes are provided to this green sheet, and a paste of e.g. Cu, Ag, Ag-Pd, Au, Au-Pt, Ni, W, Mo-Mn or Mo is printed in a predetermined circuit pattern on one side of the sheet. At that time, the paste of e.g. Cu, Ag, Ag-Pd, Au, Au-Pt, Ni, W, Mo-Mn or Mo is filled in the through-holes. Then, a predetermined number of such printed green sheets are overlaid one on another, laminated by heat-bonding and fired to obtain a multi-layered glass ceramic substrate. As the fired conditions, when a conductor of Ag-Pd, Au or Au-Pt is used, the firing is conducted in air at a temperature of from 600 to 1050° C., and when a conductor of Cu, Ni or Mo-Mn is used, the firing is conducted in an inert atmosphere such as nitrogen or in a nitrogen-hydrogen atmosphere at a temperature of from 600 to 1400° C.

The multi-layered glass ceramic substrate thus prepared has a structure in which circuits are laminated in a plurality of layers with insulating substrates interposed therebetween.

In the foregoing example, the process has been described with respect to the preparation of a multi-example, layered glass ceramic substrate. However, it is of course possible to prepare a single layer ceramic substrate by omitting the lamination step. Such a single layer or multi-layered glass ceramic substrate can be used for a hybrid package.

When the above-mentioned AlN substrate 1 and the above illustrated several kinds of glass ceramic substrate 2 are used for hybrid packages, the difference in the thermal expansion coefficients is represented by $|\alpha-\beta| \leq 20\times 10^{-7\circ}$ C. $^{-1}$, where $\alpha$ is the thermal expansion coefficient of the glass ceramic substrate 2 at a temperature of at higher than 500° C. and $\beta$ is the thermal expansion coefficient of the AlN substrate 1. It is substantially small as compared with the difference in the thermal expansion coefficient of from 27 to $32\times 10^{-7\circ}$ C.$^{-1}$ between the AlN substrate and the $Al_2O_3$ substrate, such being desirable. From the viewpoint of the reliability, $|\alpha-\beta| \leq 10\times 10^{-7\circ}$ C.$^{-1}$ is more preferred.

Within the above range, a particularly preferred range is $3\times 10^{-7\circ}$ C.$^{-1} \leq \alpha-\beta \leq 6\times 10^{-7\circ}$ C.$^{-1}$.

Figure 4:
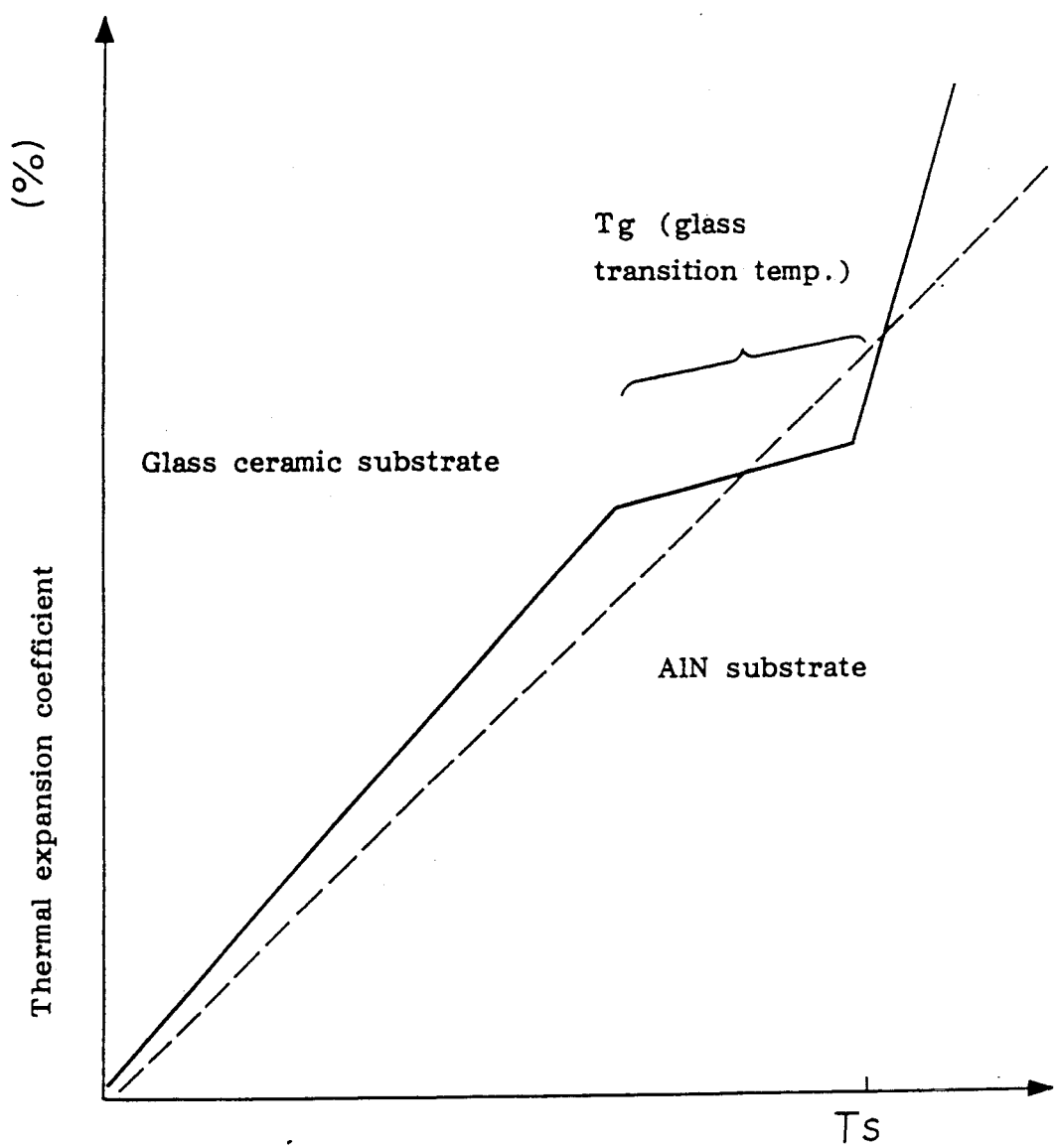
FIG. 4 is a graph showing the thermal expansion coefficient-temperature characteristics of a glass ceramic substrate and an AlN substrate.

In FIG. 4, the thermal expansion coefficient-temperature characteristics of the glass ceramic substrate and the AlN substrate, are shown. In FIG. 4, Tg is a glass transition temperature where the glass starts to vitrify, which has a width of about 100° C. within a range of from 700 to 1000° C. Ts is a glass softening temperature. As shown in FIG. 4, the thermal expansion coefficient of glass increases by about three times when the temperature exceeds Ts. The thermal expansion coefficient of a glass ceramic substrate containing glass varies within Tg or before and after Tg, since glass has such complicated characteristics.

Accordingly, the above-mentioned particularly preferred range of $\alpha-\beta$ is specified for the following reason. When the AlN substrate 1 and the glass ceramic substrate 2 shown in FIG. 1 are to be bonded, the temperature is required to be at a level of from 800 to 1000° C. whether silver solder or a glass layer is used for the bonding portion 5. The above-mentioned particularly preferred range of $\alpha-\beta$ is effective to minimize the internal stress of the bonding portion 5.

By the above-mentioned hybrid method, it is unnecessary to form any special metal layer to reduce the difference in the thermal expansion at the bonding portion 5. Adequate reliability can be obtained by a usual bonding method such as metal bonding by means of solder or silver copper braze material, or by a glass bonding adhesive by means of a low melting point of glass. In the case of bonding by an adhesive, an adhesive of e.g. an epoxy type or polyimide type may usually be used. When $|\alpha-\beta|$ exceeds $20 \times 10^{-7}$° C.$^{-1}$ it is necessary to reduce the stress formed by the difference in the thermal expansion coefficient and therefore a special structure will be required, such being undesirable.

The hybrid package of the present invention is prepared by using glass ceramic substrates 2 and 3 having openings 6 and 10 as shown in FIG. 1, whereby sealing of an IC chip is facilitated, and there is a merit that the amount of the AlN substrate 1 having poor productivity can be reduced.

The openings 6 and 10 are not necessarily limited to be formed at only one place, but a plurality of such openings may be formed.

Further, the dielectric constant of the glass ceramic substrates 2 and 3 is preferably less than 9.0, since the dielectric constant serves to prevent the delay in the signal transmission speed.

Kovar (trade name) and 42-Alloy (trade name) are usually used as the material for the lead frame 8.

The hybrid package of FIG. 1 as described above, can be prepared in the following manner.

Figure 2:
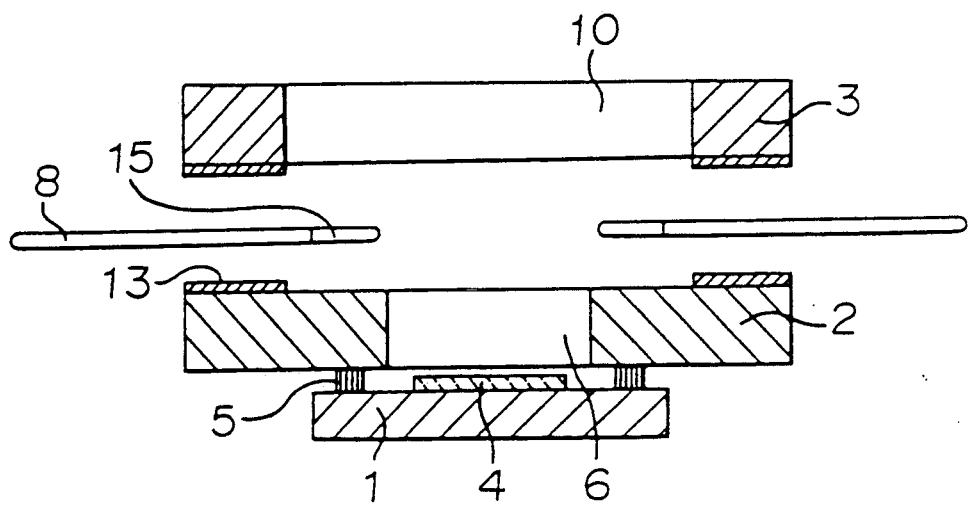
FIG. 2 is a cross sectional view of various parts showing the process for preparing the hybrid package of FIG. 1.

FIG. 2 is a cross sectional view of various parts illustrating the procedure for the preparation of the hybrid package as shown in FIG. 1. In FIG. 2, reference numeral 13 is a sealing glass, and numeral 15 is a gold plating formed on the lead frame 8. A glass ceramic substrate 2 having an opening 6 and an AlN substrate 1 are prepared. Then, a metal paste for bonding such as silver (Ag), silver-palladium (Ag-Pd) or copper (Cu) is formed by e.g. printing at the bonding portion 5 on the glass ceramic substrate 2, followed by firing. Then, a gold paste for a gold layer 4 for mounting a bare chip 11 on the AlN substrate 1, is formed by e.g. printing, and further the above-mentioned metal paste for bonding is formed by e.g. printing. Then, firing is conducted at a temperature of not higher than 1000° C., whereby silver solder or the like is formed by a method such as printing or coating at least one of the bonding portions 5 between the AlN substrate and the above-mentioned various types of the glass ceramic substrate 2, followed by heating to bond the glass ceramic substrate 2 and the AlN substrate 1. The bonding may be conducted by soldering instead of using silver copper braze material.

It is advantageous to use silver solder or solder, since it is thereby possible to electrically connect the conductor on the glass ceramic substrate 2 to the conductor on the AlN substrate 1. The AlN substrate 1 and the glass ceramic substrate 2 thus bonded, and a glass ceramic substrate 3 having an opening 10, are prepared. Then, a sealing glass paste is formed by e.g. printing on at least one of the lower surface of the glass ceramic substrate 3 and the upper surface of the glass ceramic substrate 2, and a lead frame 8 is sandwiched between the glass ceramic substrates 2 and 3, followed by heating. Thus, the glass ceramic substrates 2 and 3 will be bonded with the lead frame 8 having a gold plating 15 interposed therebetween. Then, the lead frame 8 is bent to form the structure as shown in FIG. 1. Then, as shown in FIG. 1, a bare chip 11 is introduced into the opening 6, mounted on the metal layer 4 and bonded by letting eutectic of silicone and gold form, and then bonding is conducted by a wire 12 such as a gold wire. Finally, a sealing glass paste is formed by a method such as coating or printing on at least one of the upper cover 14 and the bonding portion 9 of the glass ceramic substrate 3, followed by heating for bonding.

Another bonding method of the glass ceramic substrate 2 with the AlN substrate 1, will be described. An organic vehicle is added to glass frit. The mixture was kneaded to obtain a paste, which is coated to form a bonding portion 5. Then, the glass ceramic substrate 2 and the AlN substrate 1 are press-bonded, followed by sintering and solidification. The paste may be coated on either the glass ceramic substrate 2 or the AlN substrate 1. However, the paste may be coated on both the glass ceramic substrate 2 and the a AlN substrate 1.

The glass layer for such a bonding portion 5 is required to satisfy $|\beta-\gamma| \leq 30 \times 10^{-7}$° C.$^{-1}$ where $\gamma$ is the thermal expansion coefficient of the glass layer. If $|\beta-\gamma|$ exceeds $30 \times 10^{-7}$° C.$^{-1}$, the difference in the thermal expansion coefficients between the glass layer and the glass ceramic substrate 2 or the AlN substrate 1 tends to be substantial, whereby no adequate reliability of the bonding portion 5 will be obtained. Preferably, $|\beta-\gamma| \leq 20 \times 10^{-7}$° C.$^{-1}$, and more preferably, $|\beta-\gamma| \leq 5 \times 10^{-7}$° C.$^{-1}$.

As such a glass layer, not only glass frit but also the one having ceramic powder such as $Al_2O_3$, MgO, mullite, forsterite, steatite, cordierite, quartz or AlN incorporated as filler, may be used so long as it satisfies the above-mentioned condition for the thermal expansion coefficient. Further, there is no particular restriction as to the composition of the glass frit. For example, the glass frit may have a composition of a $B_2O_3$-$SiO_2$ system, a $B_2O_3$-$Al_2O_3$-$SiO_2$ system, a PbO-$B_2O_3$-$SiO_2$ system, a CaO-$B_2O_3$-$SiO_2$-$Al_2O_3$ system, a BaO-$B_2O_3$-$SiO_2$-$Al_2O_3$ $Al_2O_3$ system or a ZnO-$B_2O_3$-$SiO_2$ system. Further, there is no particular restriction as to an organic vehicle. The organic vehicle may be the one prepared by adding a solvent such as acetone or $\alpha$-terpineol to an organic binder such as ethyl cellulose or an acrylate resin.

Referring to the cross-sectional view of Example 3, another type of the hybrid package will now be described.

A metal paste such as a Cu paste, an Ag paste, an Ag-Pd paste or an Au paste is formed by e.g. printing in a predetermined circuit pattern on two green sheets of glass ceramic substrates having openings, and the green sheets are then laminated and pressed for bonding. Further, to bond an external terminal pin 16 made of e.g. Kovar, the above-mentioned metal paste is formed by e.g. side printing on the side surfaces 7 of the two green sheets, followed by firing. Then, the terminal pin 16 is heated and bonded by means of solder or silver copper braze material. A wire 12 is connected to a gold plating 17 formed on a conductor made of e.g. the above metal paste on a glass ceramic substrate. Other structures such as the bonding of the AlN substrate 1 and the glass ceramic substrate, are the same as in the case of the hybrid package shown in FIG. 1.

The hybrid package thus prepared has a structure in which the terminal pin 16 is not sandwiched between the glass ceramic substrates 2 and 3. The hybrid package of the present invention is not limited to the structures shown in FIGS. 1 and 3 and include all types having a structure in which a glass ceramic substrate 2 and an AlN substrate 1 are bonded to each other.

Now, the present invention will be described in further detail with reference to Examples. However, it should be understood that the present invention is by no means restricted by these specific Examples.

EXAMPLE 1

An organic binder, a plasticizer and a solvent are added to 50% of $Al_2O_3$ powder, 5% of $2MgO.SiO_2$ powder and 45% of glass frit, and the mixture was kneaded and molded to obtain a green sheet having a thickness of 1.2 mm. The above glass frit had a composition of 45% of $SiO_2$, 10% of $Al_2O_3$, 35% of $B_2O_3$ and 10% of BaO.

This green sheet was punched to obtain 100 sheets of each of a size of 30×30 mm with a center opening of 20×20 mm and the same size with a center opening of 25×25 mm, which were then fired at 1050° C. for 4 hours in air to obtain two types of glass ceramic substrates having openings 6 and 10, respectively, as shown in FIG. 2.

The thermal expansion coefficient α of these glass ceramic substrates was $45 \times 10^{-7}$° $C.^{-1}$.

Separately, a gold paste and a silver paste were formed by printing on a commercially available AlN substrate (25×25×1.0 mm) (AGN-2, manufactured by Asahi Glass Company Ltd., heat conductivity: 200 w/mK, thermal expansion coefficient: $45 \times 10^{-7}$° $C.^{-1}$), followed by firing at 900° C. for 3 hours to form a gold layer 4 and a silver layer at the bonding portion 5. Further, a silver layer is formed also on the glass ceramic substrate 2 at the bonding portion 5 in the same manner.

The AlN substrate and the glass ceramic substrate were bonded by a commercially available silver copper braze material (Ag: 72%, Cu: 28%) by heating at 900° C. for 10 minutes.

Then, a sealing glass paste was printed on the upper surface of the glass ceramic substrate 2 bonded to the AlN substrate 1 and on the lower surface of the glass ceramic substrate 3 having the opening 6 (FIG. 2), and a lead frame 8 made of Cobarl was sandwiched therebetween, followed by heating at 680° C. for 10 minutes to bond the glass ceramic substrates 2 and 3.

Then, the lead frame made of Kovar was bent to obtain a hybrid package as shown in FIG. 1. The forward end of the lead frame made of Kovar was preliminarily plated with gold.

The, as shown in FIG. 1, a bare chip was die-bonded at 430° C. within the opening, and then the gold wire was connected.

An upper cover 14 was bonded by a sealing glass paste by heating at 380° C. for 10 minutes to obtain a hybrid package as shown in FIG. 1.

The difference between the thermal expansion coefficient α of the glass ceramic substrate and the thermal expansion coefficient β of the AlN substrate constituting this hybrid package was 0, as shown below:

$$|\alpha-\beta| \leq 45 \times 10^{-7} - 45 \times 10^{-7} = 0° C.^{-1}.$$

100 pieces of this hybrid package were subjected to a heat cycle test of from +250° C. to −50° C. for 1000 cycles with each cycle being 30 minutes, whereby no formation of defects such as cracks was observed, and both the hermeticity and reliability were satisfactory.

EXAMPLE 2

An organic binder, a plasticizer and a solvent were added to 10% of $Al_2O_3$ powder, 50% of $2MgO.SiO_2$ powder and 40% of glass frit, and the mixture was kneaded and molded to obtain a green sheet having a thickness of 1.2 mm. The glass frit had a composition of 45% of $SiO_2$, 10% of $Al_2O_3$, 35% of $B_2O_3$ and 10% of BaO.

By using this green sheet and the AlN substrate AGN-2 manufactured by Asahi Glass Company Ltd., a hybrid package as shown in FIG. 1 was prepared in the same manner as in Example 1. The thermal expansion coefficient of the glass ceramic substrates was measured and found to be $62 \times 10^{-7}$° $C.^{-1}$. Thus, the difference $|\alpha-\beta|$ in the thermal expansion coefficient between the glass ceramic substrates and the AlN substrate was:
$|\alpha-\beta| = 62 \times 10^{-7} - 45 \times 10^{-7} = 17 \times 10^{-\circ}$ $C.^{-1}$.

100 pieces of this hybrid package were subjected to a heat cycle test of from +120° C. to −50° C. for 1000 cycles with each cycle being 30 minutes, whereby no formation of defects such as peeling at the bonding portion or cracks, was observed, and both the hermeticity and reliability were satisfactory.

Further, a heat cycle test was conducted with a larger temperature difference of from +250° C. to −50° C. for 1000 cycles with each cycle being 30 minutes, whereby one piece out of 1000 pieces showed fine cracks. However, such cracks were not practically problemmatic.

EXAMPLE 3

An organic binder, a plasticizer and a solvent were added to 38% of $Al_2O_3$, 57% of glass frit and 5% of $CeO_2$ powder, and the mixture was kneaded and molded to obtain a green sheet having a thickness of 1.2 mm. The glass frit had a composition of 40% of $SiO_2$, 7% of $Al_2O_3$, 8% of CaO, 15% of BaO, 10% of PbO, 10% of $B_2O_3$ and 10% of ZnO.

By using the above green sheet, a hybrid package of the same shape as in Example 1 was prepared in the same manner as in Example 1, except that a copper layer was formed at the bonding portion 5 on each of the AlN substrate and the glass ceramic substrate, and then the bonding was conducted by means of silver copper zinc braze material (Ag: 50%, Cu: 25% and Zn: 25%) by heating at 850° C. for 10 minutes.

The difference between the thermal expansion coefficient α of the glass ceramic substrate and the thermal expansion coefficient β of the AlN substrate constituting this hybrid package was:

$$|\alpha-\beta| = 54 \times 10^{-7} - 45 \times 10^{-7} = 9 \times 10^{-7}° C.^{-1}.$$

100 pieces of this hybrid package were subjected to a heat cycle test of from +250° C. to −50° C. for 1000 cycles with each cycle being 30 minutes, whereby no formation of defects such as peeling at the bonding portion or cracks, was observed, and both the hermeticity and reliability were satisfactory.

EXAMPLE 4

A solvent, a dispersing agent, an organic binder and a plasticizer were added to 10% of $Al_2O_3$ powder, 50% of $2MgO.SiO_2$ powder and 40% of glass frit, and the mixture was kneaded and molded to obtain a green sheet having a thickness of 1.2 mm. The glass frit used had a composition of 45% of $SiO_2$, 10% of $Al_2O_3$, 35% of $B_2O_3$ and 10% of BaO.

This green sheet was punched to obtain sheets of each of a size of 30×30 mm with a center opening of 20×20 mm and the same size with a center opening of 25×25 mm. The punched out sheets of each type were laminated and bonded, followed by firing in air at 1050° C. for 4 hours to obtain multi-layered glass ceramic substrates having openings 6 and 10, respectively, as shown in FIG. 2. The thermal expansion coefficient of these glass ceramic substrates was $62 \times 10^{-7}$° $C.^{-1}$.

Separately, a gold layer was formed on a commercially available AlN substrate (AGN-2, manufactured by Asahi Glass Company Ltd., size: 25×25×1.0 mm, heat conductivity: 200 w/mK, thermal expansion coefficient: $45 \times 10^{-7}$° $C.^{-1}$).

Then, an organic vehicle was added to glass frit, and the mixture was kneaded by an automatic mortar and further passed through a three roll mill to obtain a glass paste. Here, the glass frit was the same as used for the preparation of the above glass ceramic substrates. The organic vehicle had a composition of 5% of ethylcellulose and 95% of α-terpincal. Then, this glass paste was screen-printed on the bonding portion of the AlN substrate, and the AlN substrate was press-bonded to the above glass ceramic substrate 2 having an opening, followed by firing in air at 850° C. for 10 minutes to bond the glass ceramic substrate to the AlN substrate. The thermal expansion coefficient of the glass layer at the bonding portion was $43 \times 10^{-7}$° $C.^{-1}$.

Then, sealing glass paste was printed on the upper surface of the glass ceramic substrate 2 bonded to the AlN substrate 1 and the lower surface of the glass ceramic substrate 3, and a lead frame 8 made of Koval was sand-wiched therebetween, followed by heating at 680° C. for 10 minutes to bond the glass ceramic substrates 2 and 3 with the lead frame 8 interposed therebetween. Then, the lead frame 8 made of Cobarl was bent to form a hybrid package as shown in FIG. 1. The lead frame 8 made of Koval had a metal plating preliminarily plated at its forward end.

Then, as shown in FIG. 1, a bare chip was die-bonded at 430° C. on the AlN substrate, and then a gold wire was connected.

Then, the above upper cover was bonded by means of a sealing glass paste by heating at 380° C. for 10 minutes to obtain a hybrid package as shown in FIG. 1. In this hybrid package, $$|\alpha - \beta| = |62 \times 10^{-7} - 45 \times 10^{-7}|$$
$$= 17 \times 10^{-7}° C.^{-1}$$
$$|\beta - \gamma| = |45 \times 10^{-7} - 43 \times 10^{-7}|$$
$$= 2 \times 10^{-7}° C.^{-1}$$

1000 pieces of this hybrid package were subjected to heat cycle test of from +250° C. to −50° C. for 1000 cycles with each cycle being 30 minutes, whereby no formation of defects such as peeling at the bonding portion or cracks was observed, and both the hermeticity and reliability were satisfactory.

EXAMPLE 5

A solvent, a dispersing agent, an organic binder and a plasticizer were added to 38% of $Al_2O_3$, 57% of glass frit and 5% of $CeO_2$ powder, and the mixture was kneaded and molded to obtain a green sheet having a thickness of 1.2 mm. The glass frit used had a composition of 40% of $SiO_2$, 8% of $Al_2O_3$, 4% of CaO, 18% of BaO, 10% of PbO, 10% of $B_2O_3$ and 10% of ZnO.

This green sheet was punched to obtain sheets of each of a size of 30×30 mm with a center opening of 20×20 mm and the same size with a center opening of 25×25 mm. A copper paste composed of Cu powder and an organic vehicle was printed in a predetermined circuit pattern on each punched out green sheet. Such sheets were overlaid one another and pressed for bonding.

Further, for electrical connection to a terminal, a copper paste was side-printed and fired in a nitrogen atmosphere furnace at 900° C. for 6 hours, and then an terminal pin made of Kovar was bonded by means of silver copper braze material (AG: 72%, Cu: 28%) by heating at 900° C. for 10 minutes.

Separately, a metal layer was formed on an AlN substrate (AGN-2, manufactured by Asahi Glass Company Ltd.,).

Then, an organic vehicle was added to glass frit, and the mixture was kneaded by an automatic mortar and further passed through a three roll mill to obtain a glass paste. The glass frit used had a composition of 40% of $SiO_2$, 15% of $Al_2O_3$, 10% of CaO, 15% of BaO, 10% of PbO, and 10% of $B_2O_3$. The organic vehicle was the one obtained by dissolving an acrylate resin with butylcarbitol acetate.

This glass paste was screen-printed on the bonding portion of the AlN substrate, to which a glass ceramic substrate having an opening was press-bonded, followed by heating in a nitrogen atmosphere at 800° C. for 30 minutes to form a glass layer, whereby the glass ceramic substrate was bonded to the AlN substrate. The thermal expansion coefficient of this glass layer was $51 \times 10^{-7}$° $C.^{-1}$.

Figure 3:
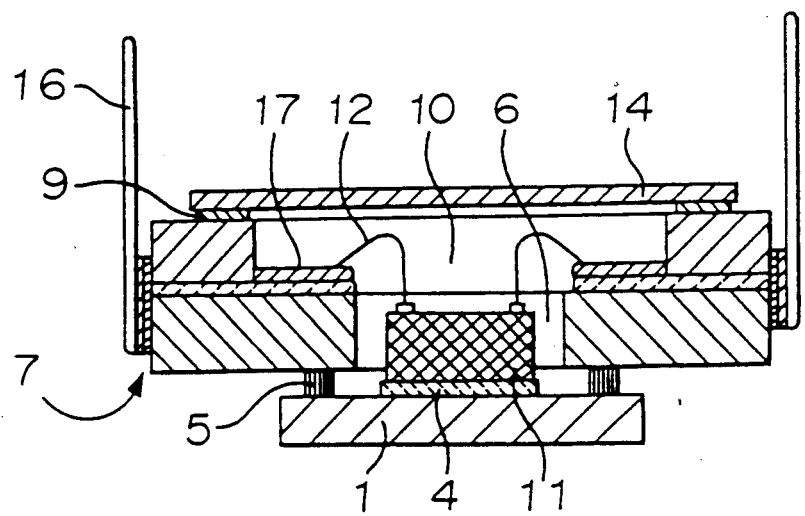
FIG. 3 is a cross sectional view of another embodiment of the hybrid package of the present invention.

Then, a bare chip was die-bonded at 430° C. on the AlN substrate, and then a gold wire was connected. Then, the upper cover was bonded by means of a sealing glass paste by heating at 380° C. for 10 minutes to obtain a hybrid package as shown in FIG. 3.

In this hybrid package, $$|\alpha - \beta| = |49 \times 10^{-7} - 45 \times 10^{-7}|$$
$$= 4 \times 10^{-7}° C.^{-1}$$
$$|\beta - \gamma| = |45 \times 10^{-7} - 51 \times 10^{-7}|$$
$$= 6 \times 10^{-7}° C.^{-1}$$

1000 pieces of this hybrid package was subjected to a heat cycle test of from +250° C. to −50° C. for 2000 cycles with each cycle being 30 minutes, whereby no formation of defects such as peeling at the bonding portion or cracks was observed, and both the hermeticity and reliability were satisfactory.

Further, with respect to 1000 pieces of this hybrid package, heat cycle test of from +350° C. to −195.8° C. (liquefied nitrogen) was conducted for 2000 cycles with each cycle being 30 minutes, whereby no formation of defects such as peeling at the bonding portion or cracks was observed, and both the hermeticity and reliability were satisfactory.

EXAMPLE 6

For the preparation of the above described glass ceramic substrates to be used for the preparation of the hybrid package of the present invention, powder materials having a composition as identified in Table 1, as calculated as oxides, were prepared, and an oxidizing agent as identified in Table 1 was added thereto. Then, an acrylate resin as the organic binder, dibutylphthalate as the plasticizer and toluene as the solvent were added thereto, and the mixture were kneaded to obtain a slurry having a viscosity of from 10000 to 30000 cps. Then, this slurry was formed into a sheet having a thickness of about 0.2 mm and then dried at 70° C. for 2 hours. Then, by using this sheet, a four-layered laminate was prepared and baked at 900° C. for 6 hours to obtain a multi-layered glass ceramic substrate.

With respect to this multi-layered glass ceramic substrate, the porosity, the dielectric constant and the flexural strength were measured.

Then, a conductive paste was screen-printed on this multi-layered glass ceramic substrate, followed by firing at a temperature of from 600° C. to 900° C., whereby the solderability was evaluated, and the results are shown in Table 1. In Table 1, if the sintering properties are poor, the porosity increases and the flexural strength decreases.

A hybrid package was prepared in the same manner as in Example 1 with respect to all the conditions such as the shapes and bonding, except that the above multi-layered glass ceramic substrates having the composition as identified in Table 1 were used instead of the glass ceramic substrates used in Example 1. The number of pieces prepared was 100 for each sample No. in Example 1 i.e. the total of 3600 pieces.

100 pieces of each of such a hybrid package were subjected to a heat cycle test from +250° C. to −50° C. for 1000 cycles with each cycle being 30 minutes, whereby no formation of defects such as peeling at the bonding portion or cracks was observed, and both the hermeticity and reliability were satisfactory.

Further, with respect to 400 pieces of the hybrid packages prepared by using glass ceramic substrates of sample Nos. 5, 8, 14 and 18 as identified in Table 1 (100 pieces for each sample No.), a heat cycle test of from +350° C. to −195.8° C. (liquefied nitrogen) was conducted for 2000 cycles with each cycle being 30 minutes whereby the results were as follows.

| Glass ceramic substrate used (identified by Sample No. in Table 1) | Peeling of the bonding portion | Cracking of the bonding portion |
| --- | --- | --- |
| Sample No. 5 (100 pieces) | 8 | 2 |
| Sample No. 8 (100 pieces) | 0 | 0 |
| Sample No. 14 (100 pieces) | 0 | 0 |
| Sample No. 18 (100 pieces) | 4 | 0 |

COMPARATIVE EXAMPLE 1

A plasticizer and a solvent were added to 55% of $2MgO.SiO_2$ and 45% of glass frit, and the mixture was kneaded and molded to obtain a green sheet having a thickness of 1.2 mm. The glass frit had a composition of 45% of $SiO_2$, 10% of $Al_2O_3$, 35% of $B_2O_3$ and 10% of BaO.

By using this green sheet and the AlN substrate AGN-2 manufactured by Asahi Glass Company Ltd., a hybrid package similar to the one in Example 1 was prepared in the same manner as in Example 1.

The heat expansion coefficient of the glass ceramic substrate was measured and found to be $68 \times 10^{-7}$° $C.^{-1}$. Thus, the difference $|\alpha - \beta|$ in the heat expansion coefficient between this glass ceramic substrate and the AlN substrate was:

$$|\alpha - \beta| = |68 \times 10^{-7} - 45 \times 10^{-7}|$$
$$= 23 \times 10^{-7} \cdot C.^{-1}$$

1000 pieces of this hybrid package were subjected to a heat cycle test of from +250° C. to −50° C. for 1000 cycles with each cycle being 30 minutes, whereby peeling of the bonding portion was observed in 236 pieces among 1000 pieces, and cracking of the bonding portion was observed with 19 pieces among 1000 pieces. Further, a heat cycle test of a larger temperature difference of from +250° C. to −50° C. was conducted for 1000 cycles with each cycle being 30 minutes, whereby peeling of the bonding portion was observed in 820 pieces among 1000 pieces, and cracking of the bonding portion was observed in 180 pieces among 1000 pieces.

COMPARATIVE EXAMPLE 2

In the same manner as in Example 4, a glass ceramic substrate having an opening as shown in FIG. 2 was prepared. The thermal expansion coefficient of this glass ceramic substrate was $62 \times 10^{-7}$° $C.^{-1}$.

Then, a silver layer was formed on the bonding portion of this glass ceramic substrate.

Separately, a gold layer and a silver layer for mounting a bare chip were formed on an AlN substrate (AGN-2, manufactured by Asahi Glass Company Ltd.). Then, the glass ceramic substrate having a silver layer and the AlN substrate were bonded by means of silver copper braze material (Ag: 72%, Cu: 28%) by heating at 900° C. for 10 minutes. The thermal expansion coefficient of this silver copper braze material was $190 \times 10^{-7}$° $C.^{-1}$. Thereafter, the operation was conducted in the same manner as in Example 4 to obtain a hybrid package as shown in FIG. 1. In this hybrid package, $$|\alpha - \beta| = |62 \times 10^{-7} - 45 \times 10^{-7}|$$
$$= 17 \times 10^{-7} \cdot C.^{-1}$$
$$|\beta - \gamma| = |45 \times 10^{-7} - 190 \times 10^{-7}|$$
$$= 145 \times 10^{-7} \cdot C.^{-1}$$

With respect to 1000 pieces of this hybrid package, a heat cycle test of from +250° C. to −50° C. was conducted for 1000 cycles with each cycle being 30 minutes, whereby no formation of defects such as peeling or cracking of the bonding portion was observed. However, when the heat cycle test was conducted under a severer condition of from +250° C. to −50° C. for 1000 cycles with each cycle being 30 minutes, fine cracks were observed in one piece among 1000 pieces. Further, when the same heat cycle test was continued for 2000 cycles, peeling was observed in 11 pieces among 1000 pieces, and fine cracks were observed in 13 pieces among 1000 pieces.

COMPARATIVE EXAMPLE 3

Hybrid packages were prepared in the same manner as in Example 1 with respect to all conditions such as shapes and bonding, except that multi-layered glass ceramics substrates having compositions as identified in the Comparative Example in Table 2 were used instead of the glass ceramic substrates used in Example 1. The number of the hybrid packages prepared was 100 pieces for each of 14 samples as identified in the Comparative Example in Table 2.

100 pieces of each hybrid package were subjected to a heat cycle test of from +125° C. to −50° C. for 1000 cycles with each cycle being 30 minutes, whereby peeling of the bonding portion was observed in 22 pieces among 100 pieces, and cracking of the bonding portion was observed in 2 pieces among 100 pieces.

CONDUCTIVE PASTES USED

Ag-Pb paste: TE-4846, manufactured by Tanaka Massey
Au paste: TR-130C, manufactured by Tanaka Massey
Cu paste: 9153, manufactured by Du Pont Company
Au-Pt paste: 5800B, manufactured by ESL Company
Ni paste: COND 5557, manufactured by ESL Company
W paste: WA-1200-AG2, manufactured by Kabushiki Kaisha Asahi Kagaku Kenkyujo
Mo-Mn paste: WA-1200-AG1, manufactured by Kabushiki Kaisha Asahi Kagaku Kenkyujo

METHODS FOR EVALUATING THE PROPERTIES

Porosity:
Measured by an Archimedean method
Dielectric constant:
The characteristic at 100 KHz was measured by an AC bridge manufactured by Ando Denki KK and evaluated.
Temperature: 25±1° C., humidity: 45±1%
Frexural Strength:
Measured by a strength tester manufactured by Toyo Boldwin. A sintered substrate was cut into a size of 12 mm in width and 50 mm in length and supported at two points with a distance of 20 mm.
Solderability Ag-Pd paste:
A sample was dipped in a solder comprising 63% of Sn, 35% of Pb and 2% of Ag at 240±5° C. for 5 seconds, and the proportion of the wetted area with the solder was evaluated.
Cu, Ni, Au-Pt conductors:
A sample was dipped in a solder comprising 64% of Sn and 36% of Pb at 250±5° C. for 5 seconds, whereupon the proportion of the wetted area with the solder was evaluated.
Au concustor:
A sample was dipped in a solder comprising 50% of In and 50% of Pb at a temperature of 260±5° C. for 5 seconds, whereupon the proportion of the wetted area with the solder was evaluated.
W, Mo-M conductor:
Ni plating was applied on a surface as a primer plating, and an Au plating was applied on the Ni plated surface, in a thickness of from 1 to 2 μm, and then it was dipped in a solder comprising 64% of Sn and 36% of Pb at 250±5° C. for 5 seconds, whereupon the proportion of the wetted area with the solder was evaluated.

TABLE 1

EXAMPLE

| | | Sample No | | | | | | | |
|---|---|---|---|---|---|---|---|---|---|
| | | 1 | 2 | 3 | 4 | 5 | 6 | 7 | 8 |
| Inorganic components (%) | Alumina | 52 | 55 | 58 | 61 | 61 | 61 | 60 | 63 |
| | SiO$_2$ | 22 | 24 | 10 | 8 | 19 | 11 | 28 | 15 |
| | PbO | 18 | 15 | 5 | 18 | 7 | 15 | 9 | 13 |
| | B$_2$O$_3$ | 5 | 2 | 13 | 2 | 4.8 | 2 | 2 | 2 |
| | MgO | 0 | 0 | 2 | 8 | 1 | 0 | 0 | 0.5 |
| | CaO | 1.998 | 0 | 1 | 0 | 7.0 | 0 | 0 | 0.5 |
| | SrO | 0 | 0 | 2 | 0 | 0 | 5 | 1 | 0.5 |
| | BaO | 1.0 | 2 | 8 | 0 | 0 | 0 | 0 | 0.5 |
| | Oxides of Ti + Zr + Hf | 0.002 | 2 | 1 | 3 | 0.2 | 6 | 0 | 5 |
| Oxidizing agent* (%) | Cr$_2$O$_3$ | 8 | 0.7 | 4 | 0.08 | 0.5 | 8 | 0 | 0 |
| | CoO | 0 | 0 | 0 | 0 | 0.5 | 0.8 | 3 | 0 |
| | V$_2$O$_5$ | 0 | 0 | 0 | 0 | 0.5 | 0 | 0 | 1.5 |
| | CeO$_5$ | 0 | 0 | 0 | 0 | 0.5 | 0 | 0 | 1 |
| | SnO$_2$ | 0 | 0 | 0 | 0 | 0.5 | 0 | 0 | 0 |
| Firing atmosphere | | Air | Air | Air | Air | Air | N$_2$ | Air | Air |
| Conductor metal | | Au | Au | Au | Ag—Pd | Au | Cu | Ag—Pd | Au—Pt |
| Porosity (%) | | 0.3 | 0.8 | 0.7 | 0.4 | 1.5 | 0.9 | 1.2 | 0.3 |
| Dielectric constant | | 7.8 | 7.8 | 8.3 | 8.6 | 8.4 | 8.8 | 7.7 | 8.6 |
| Flexural strength (kg/cm$^2$) | | 2500 | 2500 | 2400 | 2800 | 2600 | 2600 | 2500 | 2600 |
| Solderability (%) | | 96 | 100 | 96 | 96 | 100 | 100 | 100 | 100 |
| Thermal expansion coefficient × 10$^{-7}$ (°C.$^{-1}$) | | 43 | 43 | 45 | 45 | 43 | 44 | 43 | 50 |
| Insulation resistance | | 1 × 10$^{14}$ | 8 × 10$^{14}$ | 5 × 10$^{14}$ | 5 × 10$^{14}$ | 6 × 10$^{14}$ | 3 × 10$^{14}$ | 7 × 10$^{14}$ | 7 × 10$^{14}$ |

| | | Sample No | | | | | | | |
|---|---|---|---|---|---|---|---|---|---|
| | | 9 | 10 | 11 | 12 | 13 | 14 | 15 | 16 |
| Inorganic components (%) | Alumina | 62 | 62 | 62 | 60 | 60 | 61 | 61 | 68 |
| | SiO$_2$ | 17.5 | 18 | 9 | 12 | 19 | 15 | 15 | 15 |
| | PbO | 4 | 8 | 16 | 8.9 | 15 | 15 | 7 | 14 |

TABLE 1-continued

EXAMPLE

| | | | | | | | | | |
|---|---|---|---|---|---|---|---|---|---|
| | $B_2O_3$ | 0.7 | 6 | 10 | 5 | 2.5 | 3 | 3 | 1 |
| | MgO | 13 | 0.5 | 0.5 | 0 | 1 | 2 | 0 | 0 |
| | CaO | 0.5 | 0.5 | 0.5 | 14 | 0 | 1 | 1 | 0 |
| | SrO | 0.5 | 0.5 | 0.5 | 0 | 0 | 2 | 10 | 0 |
| | BaO | 0.5 | 0.5 | 0.5 | 0 | 2 | 0 | 3 | 2 |
| | Oxides of Ti + Zr + Hf | 1.3 | 4 | 1 | 0.1 | 0.5 | 1 | 0 | 0 |
| Oxidizing agent* (%) | $Cr_2O_3$ | 0 | 0.1 | 0 | 0.1 | 2.5 | 0.9 | 0 | 0 |
| | CoO | 0 | 0.5 | 0 | 0 | 0 | 0 | 8 | 1 |
| | $V_2O_5$ | 0 | 0.1 | 0 | 0 | 0 | 0 | 0 | 0 |
| | $CeO_5$ | 3 | 0.5 | 0 | 0 | 0 | 0 | 0 | 0 |
| | $SnO_2$ | 0 | 0.2 | 0.5 | 0 | 0 | 0 | 0 | 0 |
| Firing atmosphere | | Air | Air | Air | Air | Air | Air | Air | Air |
| Conductor metal | | Ag—Pt | Ag—Pd | Ag—Pd | Au | Au | Au—Pt | Au—Pt | Ag—Pd |
| Porosity (%) | | 3.0 | 2.3 | 0.5 | 0.6 | 0.1 | 0.1 | 2.1 | 0.4 |
| Dielectric constant | | 8.2 | 8.5 | 8.2 | 8.4 | 7.4 | 7.6 | 8.5 | 7.7 |
| Flexural strength ($kg/cm^2$) | | 2400 | 2600 | 2400 | 2600 | 3300 | 3500 | 2500 | 3500 |
| Solderability (%) | | 100 | 99 | 96 | 100 | 100 | 100 | 100 | 100 |
| Thermal expansion coefficient $\times 10^{-7}$ ($°C.^{-1}$) | | 49 | 49 | 52 | 46 | 48 | 49 | 53 | 51 |
| Insulation resistance | | $7 \times 10^{14}$ | $8 \times 10^{14}$ | $8 \times 10^{14}$ | $8 \times 10^{14}$ | $8 \times 10^{14}$ | $8 \times 10^{14}$ | $2 \times 10^{14}$ | $8 \times 10^{14}$ |

| | | Sample No | | | | | | | |
|---|---|---|---|---|---|---|---|---|---|
| | | 17 | 18 | 19 | 20 | 21 | 22 | 23 | 24 |
| Inorganic components (%) | Alumina | 68 | 70 | 70 | 70 | 70 | 72 | 73 | 75 |
| | $SiO_2$ | 17 | 17 | 10 | 10 | 15 | 6 | 6 | 5 |
| | PbO | 12 | 10 | 10 | 17 | 12 | 18 | 4 | 3 |
| | $B_2O_3$ | 1.5 | 1.6 | 4.9 | 1.2 | 0 | 3 | 13 | 0 |
| | MgO | 0 | 1 | 0 | 0 | 0 | 1 | 0 | 4 |
| | CaO | 0 | 0 | 1 | 0 | 0 | 0 | 0 | 4 |
| | SrO | 0 | 0 | 2 | 1 | 0 | 0 | 3.5 | 4 |
| | BaO | 1 | 0 | 2 | 0 | 1 | 0 | 0 | 0 |
| | Oxides of Ti + Zr + Hf | 0.5 | 0.4 | 0.1 | 0.8 | 2 | 0 | 0.5 | 5 |
| Oxidizing agent* (%) | $Cr_2O_3$ | 0 | 3.5 | 0 | 0 | 7 | 0.6 | 0 | 0 |
| | CoO | 5 | 0 | 3.5 | 0.05 | 0 | 0 | 0 | 0 |
| | $V_2O_5$ | 0 | 0 | 0 | 0 | 0 | 0 | 8 | 0 |
| | $CeO_5$ | 0 | 0 | 0 | 0 | 0 | 0 | 0 | 9 |
| | $SnO_2$ | 0 | 0 | 0 | 0 | 0 | 0 | 0 | 0 |
| Firing atmosphere | | Air | $N_2$ | Air | Air | Air | $N_2$ | Air | Air |
| Conductor metal | | Ag | Cu | Au | Ag—Pd | Ag | Cu | Au | Au—Pt |
| Porosity (%) | | 0.9 | 1.2 | 1.0 | 1.0 | 2.0 | 1.1 | 1.0 | 3.0 |
| Dielectric constant | | 7.8 | 7.9 | 8.0 | 8.3 | 8.8 | 8.5 | 8.5 | 9.0 |
| Flexural strength ($kg/cm^2$) | | 3100 | 3050 | 3200 | 3100 | 3000 | 3100 | 3000 | 2950 |
| Solderability (%) | | 100 | 100 | 100 | 100 | 100 | 100 | 100 | 100 |
| Thermal expansion coefficient $\times 10^{-7}$ ($°C.^{-1}$) | | 52 | 53 | 53 | 57 | 56 | 58 | 59 | 60 |
| Insulation resistance | | $4 \times 10^{14}$ | $6 \times 10^{14}$ | $6 \times 10^{14}$ | $8 \times 10^{14}$ | $2 \times 10^{14}$ | $8 \times 10^{14}$ | $4 \times 10^{13}$ | $1 \times 10^{14}$ |

| | | Sample No | | | | | | | |
|---|---|---|---|---|---|---|---|---|---|
| | | 25 | 26 | 27 | 28 | 29 | 30 | 31 | 32 |
| Inorganic components (%) | Alumina | 77.5 | 77.5 | 80 | 85 | 90 | 62 | 62 | 62 |
| | $SiO_2$ | 10 | 10 | 5 | 5 | 5 | 14 | 15 | 6 |
| | PbO | 10 | 10 | 5 | 3 | 3 | 12 | 16 | 16 |
| | $B_2O_3$ | 1.2 | 1.3 | 5 | 0.5 | 0 | 1 | 2 | 5 |
| | MgO | 0 | 0 | 0 | 0.5 | 0 | 0.2 | 0.5 | 0 |
| | CaO | 0 | 0 | 0 | 0 | 0.5 | 0.5 | 0.5 | 0 |
| | SrO | 0 | 1 | 2 | 0 | 0 | 0.5 | 0.5 | 0 |
| | BaO | 1 | 0 | 0 | 0 | 0 | 10 | 0.5 | 6 |
| | Oxides of Ti + Zr + Hf | 0.3 | 0.2 | 3 | 6 | 1.5 | 0.8 | 3 | 5 |
| Oxidizing agent* (%) | $Cr_2O_3$ | 0 | 5 | 0 | 0 | 1.5 | 0 | 1 | 0 |
| | CoO | 0 | 0 | 0.5 | 0 | 1 | 0 | 0 | 0.1 |
| | $V_2O_5$ | 2 | 0 | 0 | 0 | 0 | 0 | 0 | 0 |
| | $CeO_5$ | 0 | 0 | 0 | 0 | 0 | 0 | 0 | 0 |
| | $SnO_2$ | 0 | 0 | 0 | 9.5 | 0 | 0 | 0 | 0 |
| Firing atmosphere | | $N_2$ | $N_2$—$H_2$ | $N_2$—$H_2$ | $N_2$—$H_2$ | Air | $N_2$ | $N_2$—$H_2$ | $N_2$—$H_2$ |
| Conductor metal | | Cu | Mo—Mn | Ni | W | Au—Pt | Ni | W | Mo |
| Porosity (%) | | 1.8 | 2.0 | 2.0 | 2.0 | 3.0 | 2.5 | 0.8 | 0.6 |
| Dielectric constant | | 8.2 | 8.2 | 8.6 | 8.8 | 9.0 | 9.0 | 7.9 | 9.0 |
| Flexural strength | | 3200 | 3150 | 3000 | 3000 | 2800 | 2800 | 3100 | 3000 |

TABLE 1-continued

EXAMPLE

| (kg/cm²) | | | | | | | | | |
|---|---|---|---|---|---|---|---|---|---|
| Solderability (%) | | 100 | 100 | 100 | 100 | 100 | 100 | 100 | 100 |
| Thermal expansion coefficient × $10^{-7}$ (°C.$^{-1}$) | | 55 | 55 | 62 | 63 | 65 | 46 | 45 | 49 |
| Insulation resistance | | $8 \times 10^{14}$ | $3 \times 10^{14}$ | $7 \times 10^{14}$ | $1 \times 10^{14}$ | $7 \times 10^{14}$ | $8 \times 10^{14}$ | $8 \times 10^{14}$ | $8 \times 10^{14}$ |

| | | | Sample No | | | |
|---|---|---|---|---|---|---|
| | | | 33 | 34 | 35 | 36 |
| Inorganic components (%) | | Alumina | 63 | 65 | 65 | 67.5 |
| | | SiO$_2$ | 10 | 20 | 20 | 16 |
| | | PbO | 7 | 10 | 10 | 10 |
| | | B$_2$O$_3$ | 10 | 1 | 1 | 2 |
| | | MgO | 0 | 0 | 2.5 | 3.5 |
| | | CaO | 0 | 2 | 0 | 0 |
| | | SrO | 7 | 2 | 1 | 0 |
| | | BaO | 3 | 0 | 0 | 0 |
| | | Oxides of Ti + Zr + Hf | 0 | 0 | 0.5 | 1 |
| Oxidizing agent* (%) | | Cr$_2$O$_3$ | 10 | 0 | 0 | 0 |
| | | CoO | 0 | 8 | 2 | 0 |
| | | V$_2$O$_5$ | 0 | 0 | 0 | 3 |
| | | CeO$_5$ | 0 | 0 | 0 | 0 |
| | | SnO$_2$ | 0 | 0 | 0 | 0 |
| Firing atmosphere | | | Air | Air | Air | Air |
| Conductor metal | | | Ag | Au | Ag—Pd | Au—Pt |
| Porosity (%) | | | 0.6 | 1.8 | 0.6 | 1.0 |
| Dielectric constant | | | 8.4 | 8.2 | 7.9 | 8.0 |
| Flexural strength (kg/cm²) | | | 2500 | 2700 | 3000 | 3200 |
| Solderability (%) | | | 97 | 100 | 100 | 100 |
| Thermal expansion coefficient × $10^{-7}$ (°C.$^{-1}$) | | | 52 | 50 | 47 | 50 |
| Insulation resistance | | | $1 \times 10^{14}$ | $1 \times 10^{14}$ | $8 \times 10^{14}$ | $8 \times 10^{14}$ |

*Relative to the total amount of the above inorganic components.

TABLE 2

(COMPARATIVE EXAMPLE)

| | | Sample No | | | | | | | |
|---|---|---|---|---|---|---|---|---|---|
| | | 1 | 2 | 3 | 4 | 5 | 6 | 7 | 8 |
| Inorganic components (%) | Alumina | 40 | 45 | 50 | 50 | 55 | 57 | 60 | 66 |
| | SiO$_2$ | 15 | 35 | 25 | 15 | 7 | 10 | 6 | 4 |
| | PbO | 25.7 | 15 | 22 | 10 | 10 | 10 | 12 | 15 |
| | B$_2$O$_3$ | 0.3 | 1 | 2 | 20 | 5 | 13 | 2 | 10 |
| | MgO | 5 | 0 | 0 | 0 | 5 | 1 | 20 | 0 |
| | CaO | 2 | 2 | 0 | 2 | 5 | 0 | 0 | 2 |
| | SrO | 2 | 1.5 | 0 | 0 | 5.9 | 1 | 0 | 0 |
| | BaO | 10 | 0 | 0 | 1.5 | 5 | 0 | 0 | 2 |
| | Oxides of Ti + Zr + Hf | 0 | 0.5 | 1 | 1.5 | 3 | 8 | 0 | 1 |
| Oxidizing agent* (%) | Cr$_2$O$_3$ | 2 | 0 | 0 | 0 | 0 | 0 | 3.5 | 12 |
| | CoO | 0 | 1.5 | 0 | 0 | 0 | 0 | 0 | 0 |
| | V$_2$O$_5$ | 0 | 0 | 2.5 | 0 | 0 | 0 | 0 | 0 |
| | CeO$_5$ | 0 | 0 | 0 | 2 | 0 | 0 | 0 | 0 |
| | SnO$_2$ | 0 | 0 | 0 | 0 | 1.5 | 0 | 0 | 0 |
| Firing atmosphere | | Air | Air | Air | Air | N$_2$ | Air | Air | N$_2$—H$_2$ |
| Conductor metal | | Au | Ag | Ag—Pd | Au—Pt | Cu | Au | Au | Ni |
| Porosity (%) | | 0.1 | 0.4 | 0.3 | 0.4 | 0.6 | 0.9 | 0.2 | 0.8 |
| Dielectric constant | | 8.6 | 8.1 | 8.0 | 8.2 | 10.1 | 9.0 | 9.9 | 8.9 |
| Flexural strength (kg/cm²) | | 2000 | 1900 | 2100 | 1800 | 2100 | 2150 | 2200 | 2600 |
| Solderability (%) | | 30 | 90 | 60 | 20 | 96 | 60 | 80 | 70 |
| Thermal expansion coefficient × $10^{-7}$ (°C.$^{-1}$) | | 33 | 36 | 39 | 43 | 45 | 46 | 50 | 51 |
| Insulation resistance | | $8 \times 10^{14}$ | $8 \times 10^{14}$ | $8 \times 10^{14}$ | $3 \times 10^{11}$ | $6 \times 10^{14}$ | $6 \times 10^{11}$ | $6 \times 10^{14}$ | $6 \times 10^{9}$ |

| | | Sample No | | | | | |
|---|---|---|---|---|---|---|---|
| | | 9 | 10 | 11 | 12 | 13 | 14 |
| Inorganic components | Alumina | 70 | 72 | 75 | 80 | 85 | 93 |
| | SiO$_2$ | 10 | 8 | 4 | 10 | 5 | 3 |

TABLE 2-continued

| | | (COMPARATIVE EXAMPLE) | | | | | |
|---|---|---|---|---|---|---|---|
| (%) | PbO | 10 | 5.6 | 7 | 5 | 2 | 3 |
| | $B_2O_3$ | 1.3 | 2 | 3 | 5 | 2 | 0 |
| | MgO | 1.7 | 1 | 0 | 0 | 0 | 0 |
| | CaO | 0 | 1 | 3 | 0 | 2 | 1 |
| | SrO | 0 | 1 | 0 | 0 | 4 | 0 |
| | BaO | 2 | 5.4 | 0 | 0 | 0 | 0 |
| | Oxides of Ti + Zr + Hf | 5 | 4 | 8 | 0 | 0 | 0 |
| Oxidizing agent* (%) | $Cr_2O_3$ | 0 | 0 | 20 | 1 | 3 | 0 |
| | CoO | 13 | 0 | 0 | 1 | 0 | 3 |
| | $V_2O_5$ | 0 | 4 | 0 | 0 | 0 | 0 |
| | $CeO_5$ | 0 | 4 | 0 | 0 | 0 | 0 |
| | $SnO_2$ | 0 | 4 | 0 | 0 | 0 | 0 |
| Firing atmosphere | | Air | Air | Air | $N_2$—$H_2$ | $N_2$—$H_2$ | $N_2$—$H_2$ |
| Conductor metal | | Ag—Pd | Au—Pt | Ag—Pd | Mo—Mn | W | Mo |
| Porosity (%) | | 0.6 | 10 | 20 | 18 | 23 | 21 |
| Dielectric constant | | 9.3 | 9.2 | 8.2 | 9.1 | 9.2 | 9.3 |
| Flexural strength (kg/cm$^2$) | | 2600 | 2100 | 1600 | 1600 | 1500 | 1600 |
| Solderability (%) | | 96 | 98 | 100 | 100 | 100 | 100 |
| Thermal expansion coefficient × 10$^{-7}$ (°C.$^{-1}$) | | 59 | 59 | 60 | 61 | 62 | 75 |
| Insulation resistance | | 8 × 10$^{10}$ | 4 × 10$^{10}$ | 3 × 10$^{10}$ | 8 × 10$^{14}$ | 7 × 10$^{14}$ | 7 × 10$^{14}$ |

*Relative to the total amount of the above inorganic components.

The hybrid package of the present invention has excellent heat dissipating properties and high reliability, since a bare chip is mounted on an AlN substrate.

Further, since the difference in the heat expansion coefficient between the AlN substrate and the glass ceramic substrate, is small, it is unnecessary to form a special metal layer to reduce the difference in the thermal expansion coefficient of the bonding portion. Yet, it has excellent effects as a stress is hardly formed at the bonding portion, and defects such as peeling of the bonding portion are hardly formed.

The glass ceramic composition according to the present invention as substantially the same heat expansion coefficient has AlN and capable of providing a glass ceramic substrate for a hybrid package excellent in the electrical properties and the flexural strength.

What is claimed is:

1. A hybrid package comprising a glass ceramic substrate layer and an aluminum nitride substrate bonded to said glass ceramic substrate layer by a bonding portion; said glass ceramic substrate layer, said aluminum nitride substrate and said bonding portion each having a respective thermal expansion coefficient, said glass ceramic substrate layer and said aluminum nitride substrate having a difference in thermal expansion coefficient having an absolute value of not more than $20 \times 10^{-7}$° C., said aluminum nitride substrate and said bonding portion having a difference in thermal expansion coefficient having an absolute value of not more than $30 \times 10^{-7}$/° C.; said glass ceramic substrate layer being made of at least one glass ceramic substrate comprising inorganic components consisting essentially of from 50 to 91% by weight of alumina, from 5 to 30% by weight of $SiO_2$, from 3 to 20% by weight of PbO, from 0 to 15% by weight of $B_2O_3$, from 0.5 to 15% by weight of an alkaline earth metal oxide and from 0 to 6% by weight of oxides of Ti+Zr+HF, and from 0.05 to 10% by weight, based on the total amount of the inorganic components, of chromium oxide+vanadium oxide+cerium oxide+cobalt oxide+tin oxide where the chromium oxide is calculated as $Cr_2O_3$, the vanadium oxide is calculated as $V_2O_5$, the cerium oxide is calculated as $CeO_2$, the cobalt oxide is calculated as CoO and the tin oxide is calculated as $SnO_2$.

2. The hybrid package according to claim 1, wherein said glass ceramic substrate layer and said aluminum nitride substrate have a difference in thermal expansion coefficient having an absolute value of not more than $10 \times 10^{-7}$/° C.

3. The hybrid package according to claim 1, wherein said glass ceramic substrate layer and said aluminum nitride substrate have a difference in thermal expansion coefficient having an absolute value in the range of from $3 \times 10^{-7}$/° C. to $6 \times 10^{-7}$/° C.

4. The hybrid package according to claim 1, wherein said bonding portion comprises silver copper braze material.

5. The hybrid package according to claim 1, wherein said bonding portion comprises a glass.

6. The hybrid package according to claim 1, wherein said glass ceramic substrate layer comprises two glass ceramic substrates having center openings and bonded to each other with a lead frame interposed therebetween so that said center openings substantially overlap each other, said aluminum nitride substrate bonded to one of the two glass ceramic substrates to cover its opening; and wherein said hybrid package further comprises a ceramic cover bonded to the other glass ceramic substrate to cover its opening and an IC bare chip mounted on said aluminum nitride substrate and electrically connected to said lead frame.

7. The hybrid package according to claim 1, wherein said glass ceramic substrate layer comprises two glass ceramic substrates having center openings and bonded to each other so that said center openings substantially overlap each other, said aluminum nitride substrate bonded to one of the two glass ceramic substrates to cover its opening; and wherein said hybrid package further comprises a ceramic cover bonded to the other glass ceramic substrate to cover its opening, a lead frame bonded to an outer peripheral side surface of said bonded two glass ceramic substrates, and an IC bare chip mounted on said aluminum nitride substrate and electrically connected to said lead frame.

* * * * *